United States Patent
Chen (10) Patent No.: US 10,643,880 B2
(45) Date of Patent: May 5, 2020

(54) METHOD FOR TRANSFERRING MICRO DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 208 days.

(21) Appl. No.: 15/896,007

(22) Filed: Feb. 13, 2018

(65) Prior Publication Data

US 2019/0252232 A1    Aug. 15, 2019

(51) Int. Cl.
*H01L 21/683* (2006.01)
*H01L 21/677* (2006.01)
(Continued)

(52) U.S. Cl.
CPC .... *H01L 21/6838* (2013.01); *H01L 21/02513* (2013.01); *H01L 21/449* (2013.01); *H01L 21/67144* (2013.01); *H01L 21/67721* (2013.01); *H01L 21/67778* (2013.01); *H01L 21/786* (2013.01); *H01L 27/153* (2013.01);
(Continued)

(58) Field of Classification Search
CPC ....... H01L 2224/97; H01L 2924/00014; H01L 21/67144; H01L 2224/808; H01L 2224/838; H01L 21/67721; H01L 2224/08225; H01L 2224/80001; H01L 2224/80085; H01L 2224/80894; H01L 2224/83; H01L 24/08; H01L 24/80; H01L 2924/12041; H01L 2924/14; H01L 2924/1461; H01L 21/02513; H01L 21/447; H01L 21/449; H01L 21/52; H01L 21/67778; H01L 21/6835; H01L 21/6838; H01L 21/786; H01L 2221/68354; H01L 2221/68368; H01L 2221/68381; H01L 2224/75725; H01L 2224/75735; H01L 2224/75745; H01L 2224/7598; H01L 2224/80004; H01L 2224/80097; H01L 2224/80986; H01L 2224/83002; H01L 2224/83097; H01L 2224/83986; H01L 2224/95136; H01L 2224/95146; H01L 24/97; H01L 27/153; B65G 47/90
See application file for complete search history.

(56) References Cited

U.S. PATENT DOCUMENTS 9,722,134 B1 *  8/2017  Chen ............... H01L 33/005
2009/0199960 A1 *  8/2009  Nuzzo ............... B82Y 10/00
                                                  156/230

(Continued)

FOREIGN PATENT DOCUMENTS

WO    WO-02063678 A1 *  8/2002  ......... H01L 21/6835

*Primary Examiner* — Sonya M Sengupta
(74) *Attorney, Agent, or Firm* — CKC & Partners Co., LLC (57) ABSTRACT

A method for transferring a micro device is provided. The method includes: preparing a carrier substrate with the micro device thereon, wherein an adhesive layer is present between and in contact with the carrier substrate and the micro device; picking up the micro-device from the carrier substrate by a transfer head; forming a liquid layer on a receiving substrate; and placing the micro device over the receiving substrate so that the micro device is in contact with the liquid layer and is gripped by a capillary force.

5 Claims, 10 Drawing Sheets

(51) Int. Cl.
  *H01L 21/02* (2006.01)
  *H01L 21/786* (2006.01)
  *H01L 27/15* (2006.01)
  *H01L 21/449* (2006.01)
  *H01L 21/67* (2006.01)
  *H01L 21/52* (2006.01)
  *H01L 21/447* (2006.01)

(52) U.S. Cl.
  CPC ............ *H01L 21/447* (2013.01); *H01L 21/52* (2013.01); *H01L 2221/68368* (2013.01)

(56) References Cited

U.S. PATENT DOCUMENTS

| | | | | |
|---|---|---|---|---|
| 2014/0340900 | A1* | 11/2014 | Bathurst | F21K 9/00 362/249.02 |
| 2014/0355168 | A1* | 12/2014 | Bibl | H01L 21/76802 361/234 |
| 2017/0036342 | A1* | 2/2017 | Chen | B25J 15/008 |

* cited by examiner

Fig. 8B

METHOD FOR TRANSFERRING MICRO DEVICE

BACKGROUND

Field of Invention

The present disclosure relates to a method for transferring a micro device from a carrier substrate to a receiving substrate.

Description of Related Art

In the recent years, light-emitting diodes (LEDs) have become popular in general and commercial lighting applications. As light sources, LEDs have many advantages including low energy consumption, long lifetime, small size, and fast switching, and hence conventional lighting, such as incandescent lighting, is gradually replaced by LED lights.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" which involves two bonding/de-bonding steps. In transfer printing, a transfer wafer may pick up an array of devices from a donor wafer, and then bond the array of devices to a receiving wafer, followed by removal of the transfer wafer.

SUMMARY

According to some embodiments of the present disclosure, a method for transferring a micro device is provided. The method includes: preparing a carrier substrate with the micro device thereon, wherein an adhesive layer is present between and in contact with the carrier substrate and the micro device; picking up the micro-device from the carrier substrate by a transfer head; forming a liquid layer on a receiving substrate; and placing the micro device over the receiving substrate so that the micro device is in contact with the liquid layer and is gripped by a capillary force.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
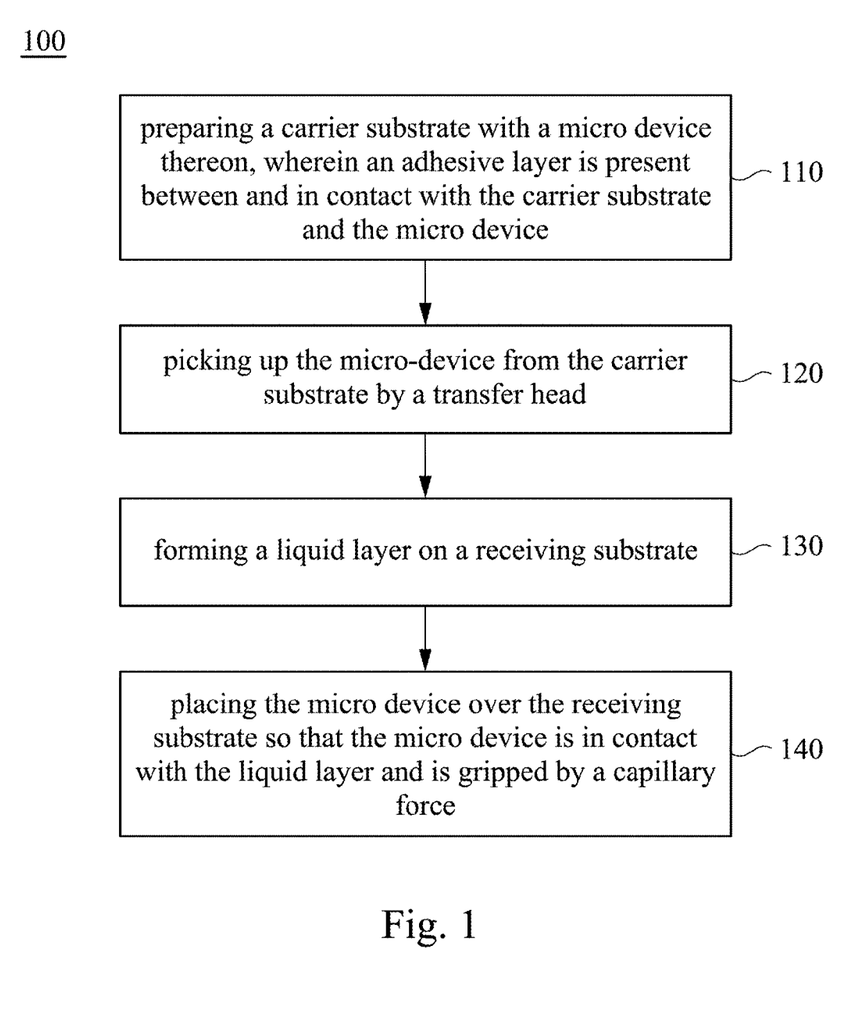
FIG. 1 is a flow chart of a method for transferring a micro device from a carrier substrate to a receiving substrate in some embodiments of the present disclosure.

FIG. 1 is a flow chart of a method for transferring a micro device from a carrier substrate to a receiving substrate. FIGS. 2 to 7 are schematic cross-sectional views of intermediate steps of the method 100 of FIG. 1. References are made to FIGS. 1 to 7. The method 100 begins with operation 110 in which a carrier substrate 210 is prepared with a micro device 220 thereon. An adhesive layer 230 is present between and in contact with the carrier substrate 210 and the micro device 220 (referring to FIG. 2). The method 100 continues with operation 120 in which the micro device 220 is picked up from the carrier substrate 210 by a transfer head 240 (referring to FIG. 3). The method 100 continues with operations 130 and 140 in which a liquid layer 250 or a patterned liquid layer 250 is formed on a receiving substrate 260 (referring to FIGS. 4A and 4B), and then the micro device 220 which has been picked up is placed over the receiving substrate 260, so that the micro device 220 is in contact with the liquid layer 250 and is gripped by a capillary force produced by the liquid layer 250 (referring to FIGS. 5A, 5B, and 6). After the gripping, the transfer head 240 is detached from the micro device 220, and the micro device 220 remained on the receiving substrate 260 and is substantially held in a position within a controllable region on the receiving substrate 260 (referring to FIG. 7).

Although in previous paragraph and FIG. 1 only "a" micro device 220 is illustrated, "multiple" micro devices 220 may be used in practical applications and is still within the scope of the present disclosure, as will be illustrated in the following embodiments.

Figure 2:
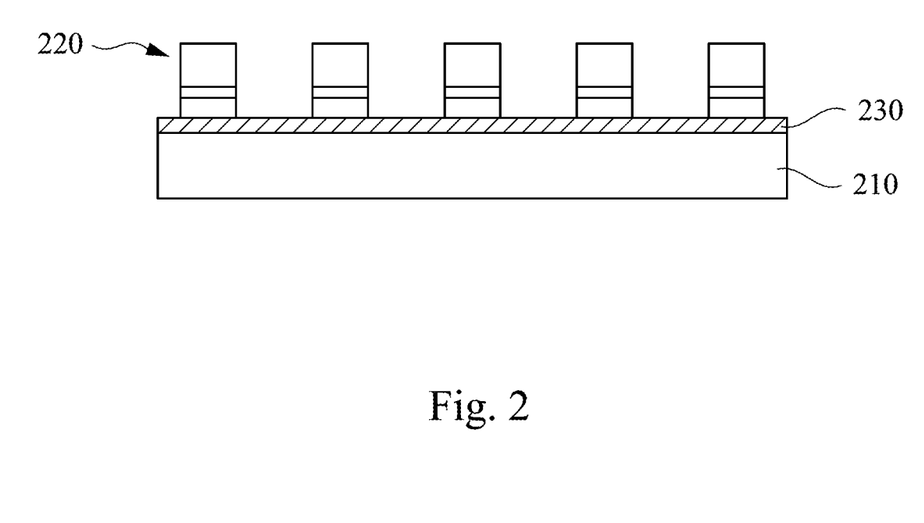
FIG. 2 is a schematic cross-sectional view of an intermediate step of the method for transferring the micro device in some embodiments of the present disclosure.

Reference is made to FIG. 2. As mentioned above, the adhesive layer 230 is present between the carrier substrate 210 and a plurality of micro devices 220. Specifically, the adhesive layer 230 is in contact with the carrier substrate 210 and the micro devices 220. In some embodiments, the formation of the adhesive layer 230 is performed by coating an adhesive capable material onto the carrier substrate 210. The adhesive layer 230 may be coated by a spin coater, a slit coater, or any combination thereof. In some embodiments, the adhesive layer 230 may be made of an adhesion capable organic material, such as epoxy, polymethylmethacrylate (PMMA), polysiloxanes, silicone, or any combination thereof. Furthermore, the adhesive layer 230 may have a thickness in a range from about 1 μm to about 100 μm.

An adhesive force $f_{AD}$ is an adhesive force of the adhesive layer 230 to each of the micro devices 220 after reduction. Said reduction is reducing an original adhesive force of the adhesive layer 230 to each of the micro devices 220, which may be performed before some of the micro devices 220 are picked up. In some embodiments, the reduction may be performed by applying an electric field, an electromagnetic radiation, heat, ultrasound, a mechanical force, a pressure, or any combination thereof on the adhesive layer 230, and should not be limited thereto. In some embodiments, a lateral length of one of the micro devices 220 is about 1 μm to 100 μm. For example, for one micro device 220 with a surface area about 10 μm×10 μm, said reduced adhesive force $f_{AD}$ is about 50 nanonewton (nN). Embodiments of this disclosure are not limited thereto. Proper modifications to the adhesive layer 230 depending on an actual application may be performed. The adhesive force $f_{AD}$ may include van der Waals forces, but should not be limited thereto.

In some embodiments, the carrier substrate 210 may be a rigid substrate. The rigid substrate may be made of glass, silicon, polycarbonate (PC), acrylonitrile butadiene styrene (ABS), or any combination thereof. Embodiments of this disclosure are not limited thereto. Proper modifications to the carrier substrate 210 depending on an actual application may be performed.

In some embodiments, the micro devices 220 may be a light emitting structure such as a compound semiconductor having a bandgap corresponding to a specific region in the spectrum. For example, the light emitting structure may include one or more layers based on II-VI materials (e.g. ZnSe, ZnO) or III-V nitride materials (e.g. GaN, AlN, InN, InGaN, GaP, AlInGaP, AlGaAs or alloys thereof). In some other embodiments, the micro devices 220 may also be integrated circuits (IC) or microelectromechanical system (MEMS) devices, and should not be limited thereto.

Figure 3:
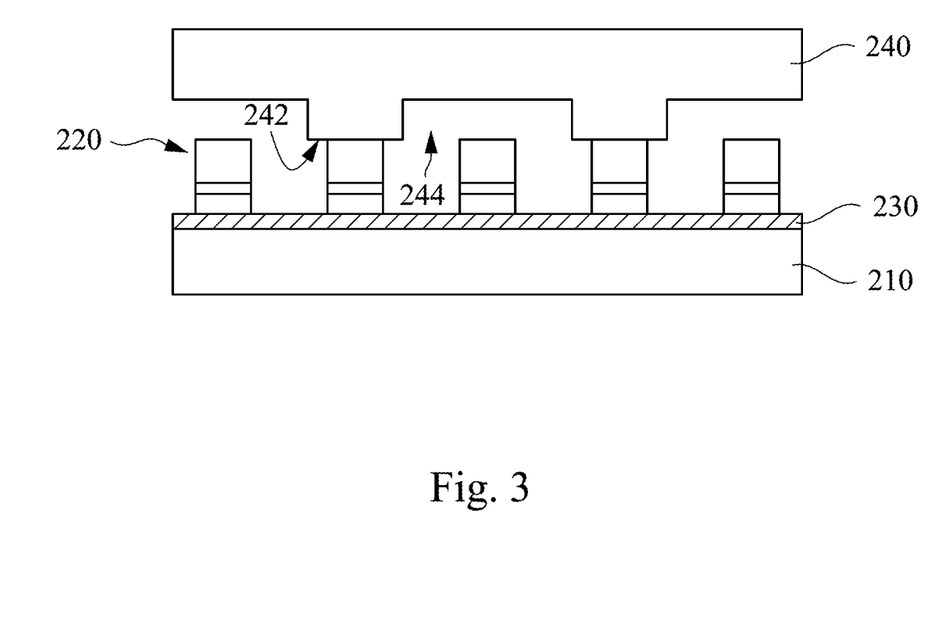
FIG. 3 is a schematic cross-sectional view of an intermediate step of the method for transferring the micro device in some embodiments of the present disclosure.

Reference is made to FIG. 3. As mentioned above, some of the micro devices 220 are picked up from the carrier substrate 210 by the transfer head 240. In some embodiments, the transfer head 240 may exert a picking-up pressure or a picking-up force on each of the micro devices 220 by way of, for example, vacuum, adhesion, magnetic attraction, electrostatic attraction, or the like. Hereinafter only adhesive force will be discussed, but other types of forces mentioned above are still within the scope of the present disclosure. In some embodiments, the transfer head 240 may have a plurality of grip regions 242 for picking up the micro devices 220. There may also be recesses 244 present between the grip regions 242. The grip regions 242 of the transfer head 240 may be made of an adhesion capable material or, the transfer head 240 may have a patterned adhesive layer thereon, such that when the transfer head 240 is in contact with the micro devices 220, each of the micro devices 220 may be picked up by an adhesive force $f_{TD}$. In some embodiments, for one micro device 220 with a surface area about 10 μm×10 μm, said adhesive force $f_{TD}$ is about 100 nN to 1000 nN for one micro device 220. The adhesive force $f_{TD}$ may include van der Waals forces, but should not be limited thereto.

As mentioned above, in some embodiments, the original adhesive force may be reduced before the picking up to form the adhesive force $f_{AD}$, so that the adhesive force $f_{TD}$ is greater than the adhesive force $f_{AD}$ when the picking up is performed.

Figure 4A:
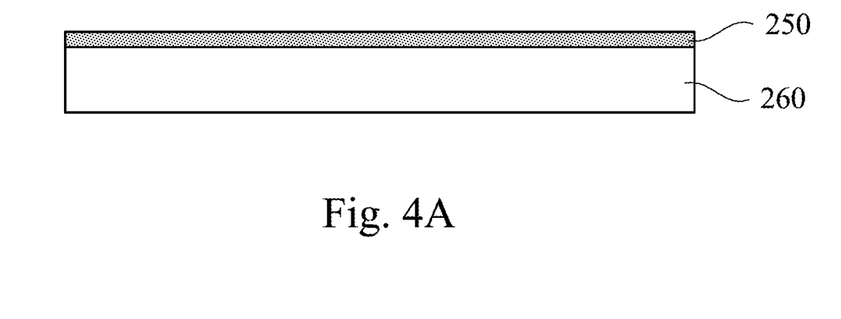
FIG. 4A is a schematic cross-sectional view of an intermediate step of the method for transferring the micro device in some embodiments of the present disclosure.
Figure 4B:
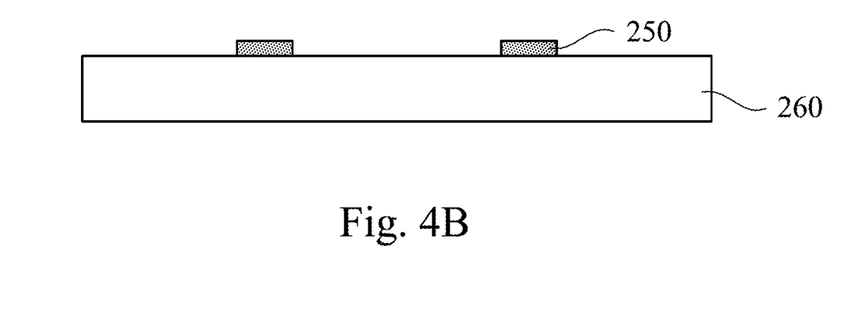
FIG. 4B is a schematic cross-sectional view of an intermediate step of the method for transferring the micro device in some embodiments of the present disclosure.

Reference is made to FIGS. 4A and 4B. As mentioned above, the liquid layer 250 is formed on the receiving substrate 260. The liquid layer 250 may be formed to be one layer on the receiving substrate 260 as shown in FIG. 4A or patterned to be discrete portions on the receiving substrate 260 as shown in FIG. 4B. In FIG. 4B the patterned liquid layer 250 may be the position where the micro devices 220 will be placed over. The receiving substrate 260 may be a display substrate, a lighting substrate, a substrate with functional devices such as transistors or integrated circuits, or a substrate with metal redistribution lines, but should not be limited thereto. In some embodiments, the liquid layer 250 may be formed by lowering a temperature of the receiving substrate 260 in an environment including a vapor, such that at least a part of the vapor is condensed to form the liquid layer 250 on the receiving substrate 260. In some embodiments, the temperature of the receiving substrate 260 is lowered to about the water dew point, such that the water vapor in the environment is condensed to form liquid water serving as the liquid layer 250. In these embodiments, the liquid layer 250 includes water. In alternative embodiments, the liquid layer 250 may include methyl alcohol, ethanol, glycerol, combinations thereof, or the like. Furthermore, the formation of the liquid layer 250 may also be achieved by inkjet printing, roller coating, dip coating, or the like.

Figure 5A:
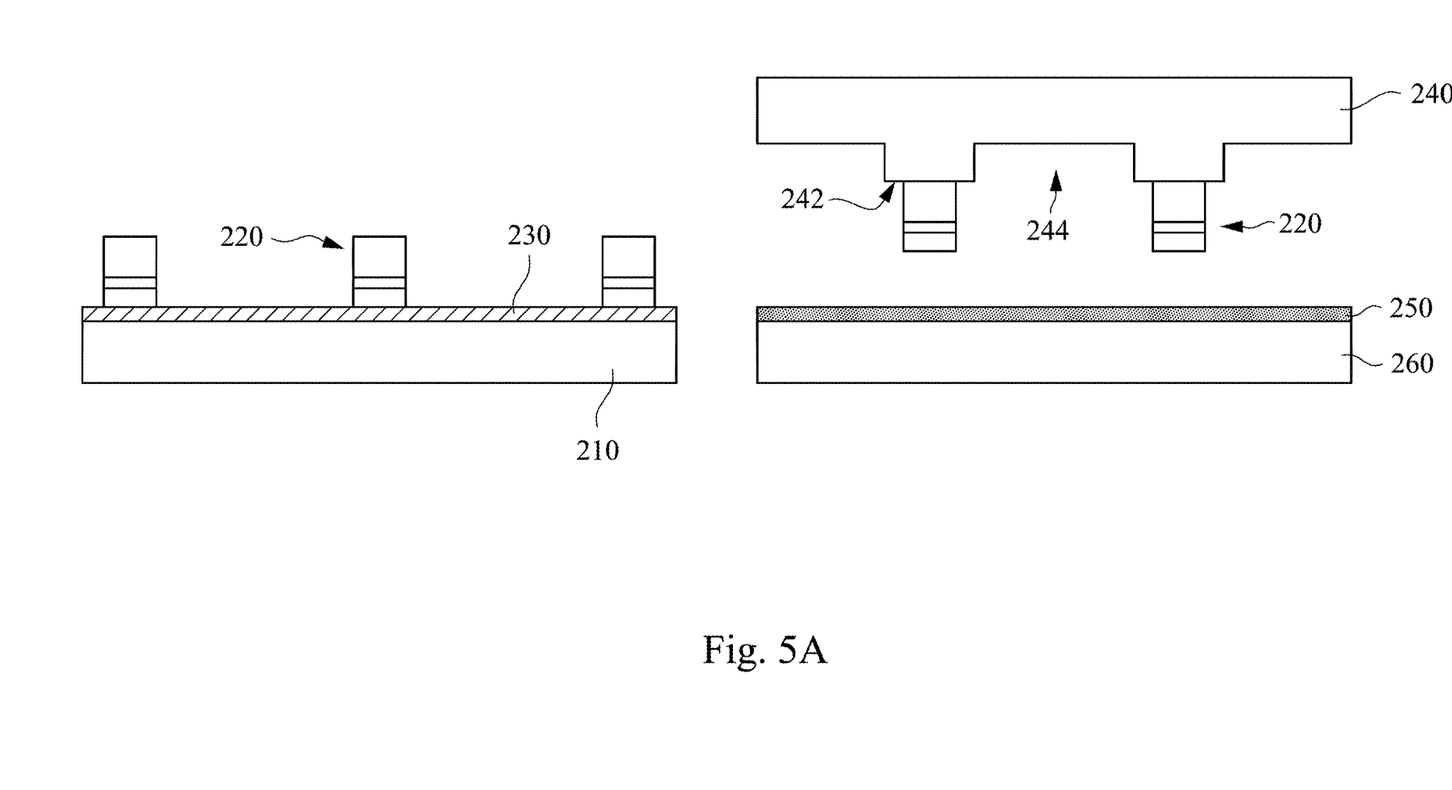
FIG. 5A is a schematic cross-sectional view of an intermediate step of the method for transferring the micro device in some embodiments of the present disclosure.
Figure 5B:
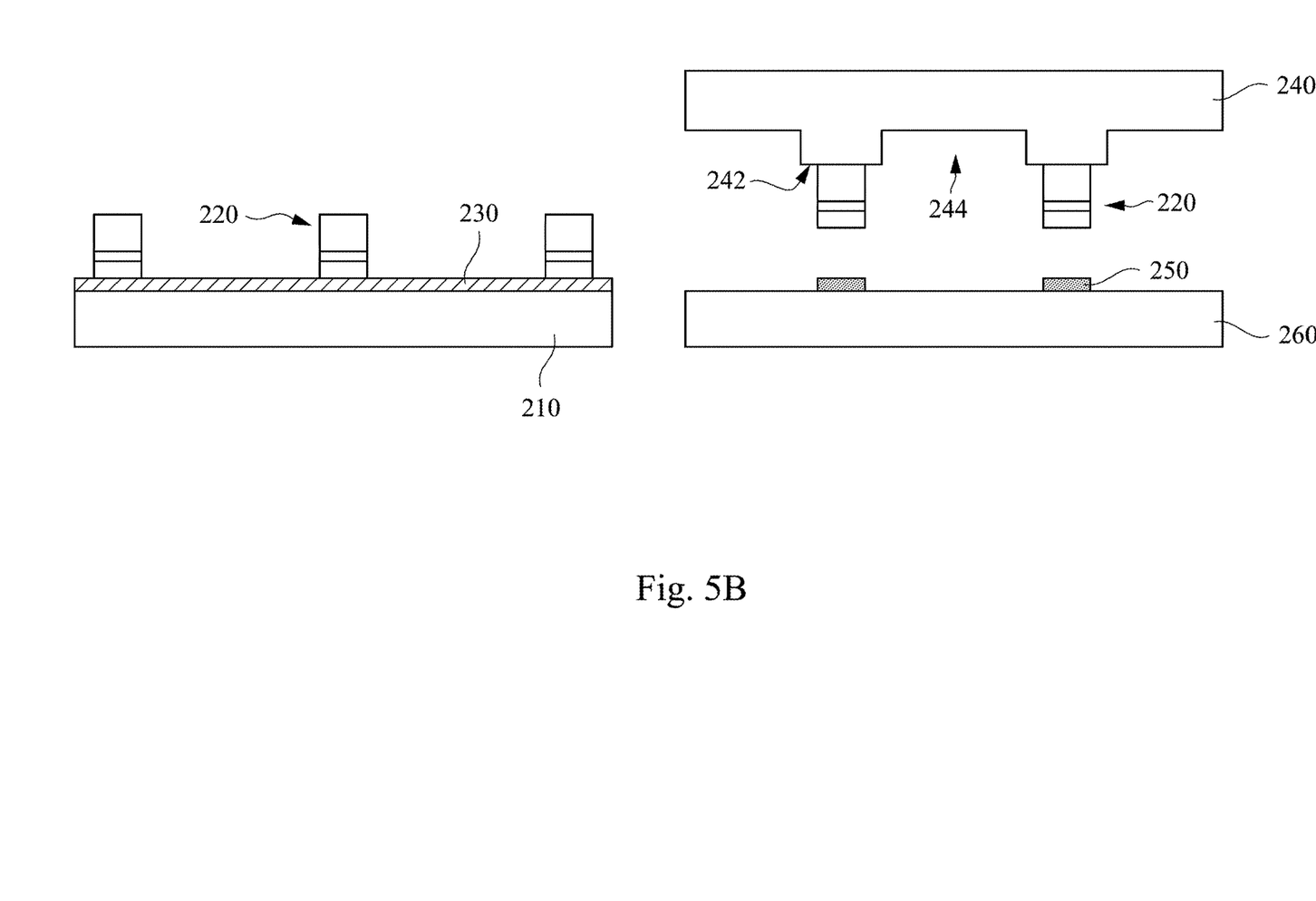
FIG. 5B is a schematic cross-sectional view of an intermediate step of the method for transferring the micro device in some embodiments of the present disclosure.
Figure 6:
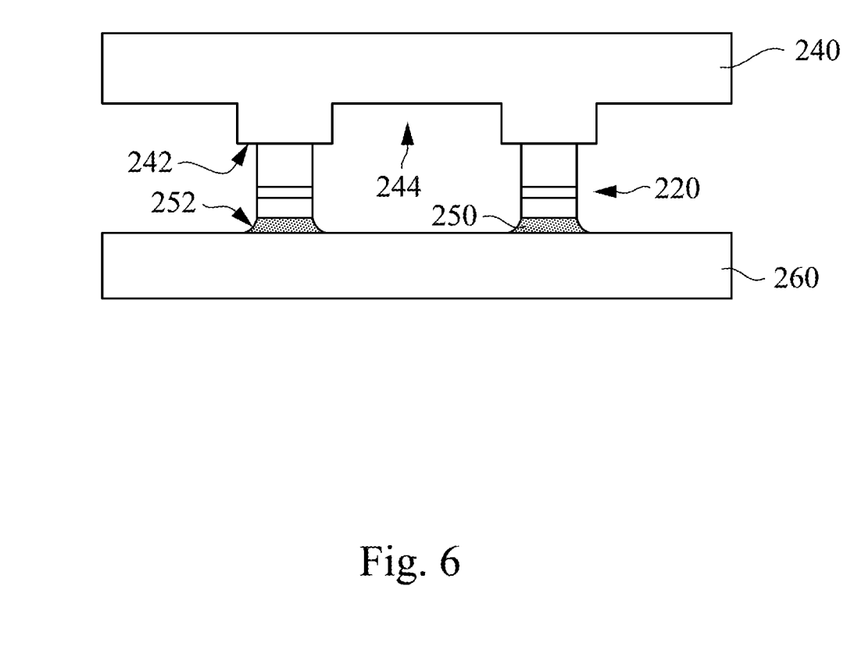
FIG. 6 is a schematic cross-sectional view of an intermediate step of the method for transferring the micro device in some embodiments of the present disclosure.

References are made to FIGS. 5A, 5B and 6. As mentioned above, the micro devices 220 which have been picked up are placed over the receiving substrate 260 by the transfer head 240, so that each of the micro devices 220 is in contact with the liquid layer 250 and gripped by a capillary force $f_{CF}$. Specifically, the micro devices 220 are placed in close proximity to the receiving substrate 260, so that the liquid layer 250 can grip the micro devices 220. The meniscuses 252 of the liquid layer 250 as shown in FIG. 6 are caused by the capillary force $f_{CF}$. The micro devices 220 are gripped by the capillary force $f_{CF}$ produced by the liquid layer 250 between the micro devices 220 and the receiving substrate 260. In some embodiments, a thickness of the liquid layer 250 is less than a thickness of the micro devices 220 when the micro devices 220 are gripped by the capillary force $f_{CF}$. In some embodiments, the receiving substrate 260 may further include at least one conductive pad thereon, and one of the micro devices 220 is in close proximity to the conductive pad and is gripped by the capillary force produced by the liquid layer 250 between one of the micro devices 220 and the conductive pad.

Figure 7:
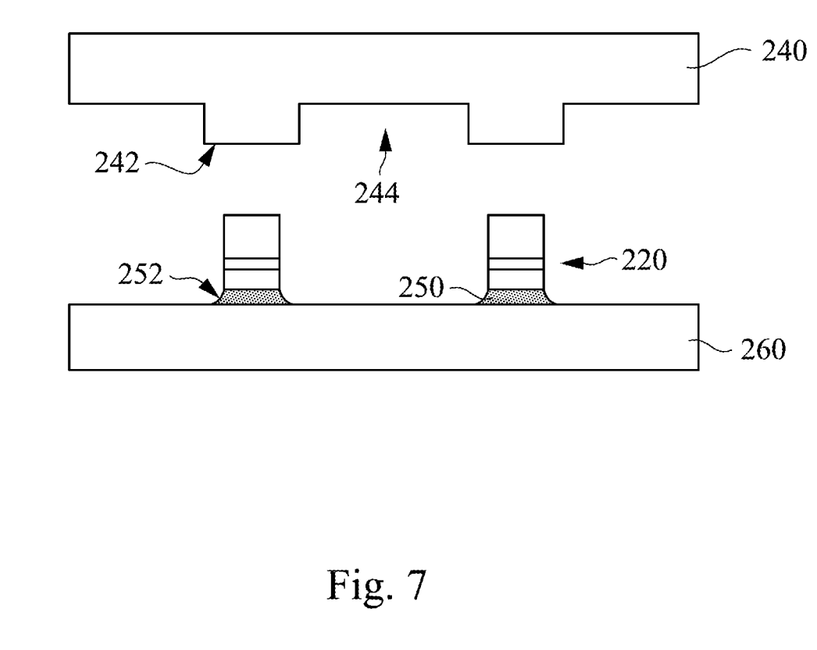
FIG. 7 is a schematic cross-sectional view of an intermediate step of the method for transferring the micro device in some embodiments of the present disclosure.

Reference is made to FIG. 7. As mentioned above, the micro devices 220 are detached from the transfer head 240 after the micro devices 220 are gripped by the capillary force $f_{CF}$. In some embodiments, the micro devices 220 are adhered to the adhesive layer 230 by an adhesive force $f_{AD}$. Some of the micro devices 220 are attached to the transfer head 240 by the adhesive force $f_{TD}$, and the capillary force $f_{CF}$ is greater than the adhesive force $f_{TD}$ so that the micro devices 220 are detached from the transfer head 240 and are stuck to the receiving substrate 260 when the placing is performed.

Specifically, a lateral length of one of the micro devices 220 may be less than 40 μm, but should not be limited thereto. One of the micro devices 220 may also be a cylindrical, a triangular, a cuboid, a hexagonal, an octagonal, or a polygon in other embodiments. As a result, the capillary force $f_{CF}$ is greater than the adhesive force $N_{TD}$ due to a size effect of the micro devices 220. Specifically, regarding the micro devices 220 with a size within about a range mentioned above, the capillary force $f_{CF}$ becomes a dominant force since an influence of a capillary force on an object will gradually dominate other forces applied on the object when a size of the object gradually scales down. More specifically, the forces applied to the micro devices 220 with the size within the range mentioned in these embodiments will obey the following inequality:

$$f_{AD} < f_{TD} < f_{CF} \qquad (1)$$

wherein the left-hand side of inequality (1) $f_{AD} < f_{TD}$ may be satisfied by choosing suitable combination of materials for the adhesive layer 230 and surfaces of the grip regions 242 in contact with the micro devices 220 respectively. Generally, the adhesive forces $f_{AD}$ and $f_{TD}$ per unit area do not change depend on a size of the micro devices 220. In some embodiments, the adhesive force $f_{TD}$ may be additionally modified by the speed of moving up the transfer head 240 away from the carrier substrate 210 after the transfer head 240 is in contact with the micro devices 220. The faster the speed is, the greater the adhesive force $f_{TD}$ is. As such, transfer processes mentioned above may be achieved with adhesive type transfer head 240. Complicated circuit designs or mechanical designs for transfer heads operated by electrostatics force, vacuum force, mechanical force, or any combination thereof can be omitted. An adhesive type transfer head 240 is capable of completing the transfer processes, and the cost of the processes is reduced.

After completing the transfer processes, the liquid layer 250 is evaporated, such that at least one micro device 220 is bound to the receiving substrate 260 or at least one conductive pad on the receiving substrate 260. The micro devices 220 may have electrodes thereon respectively for electrically contacting with the receiving substrate 260 via the conductive pads. Details of conductive pads and electrodes are omitted herein. The evaporation of the liquid layer 250 may be achieved by, for example, raising a temperature of the receiving substrate 260 or the conductive pads. After the liquid layer 250 is evaporated, the micro devices 220 are stuck to the receiving substrate 260.

In the above embodiments supported by FIGS. 1 to 7, after some of the micro devices 220 are placed over the receiving substrate 260, the micro devices 220 are gripped by the capillary force $f_{CF}$ produced by the liquid layer 250 between the micro devices 220 and the receiving substrate 260. As such, an adhesive type transfer head 240 without complicated circuit design is capable of completing the transfer processes due to the presence of the liquid layer 250, and the cost of the processes are reduced.

Figure 8A:
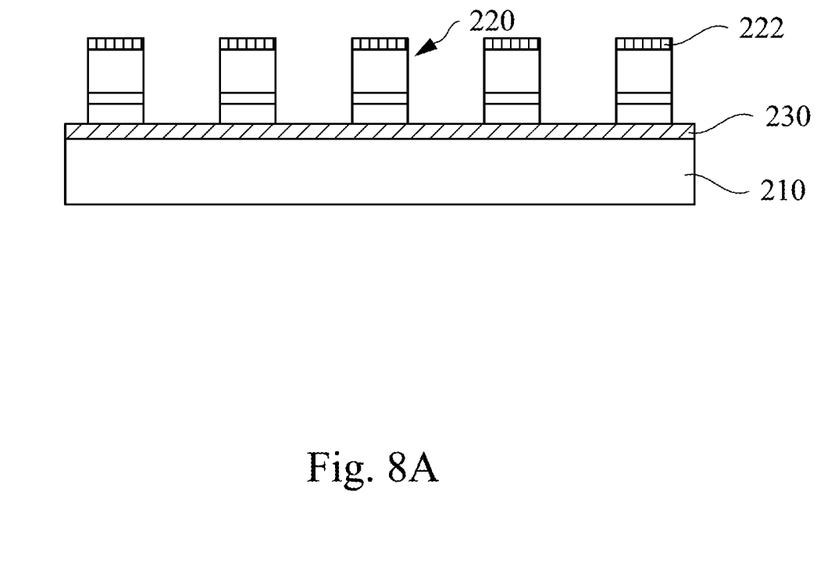
FIG. 8A is a schematic cross-sectional view of an intermediate step of the method for transferring the micro device in some embodiments of the present disclosure.
Figure 8B:
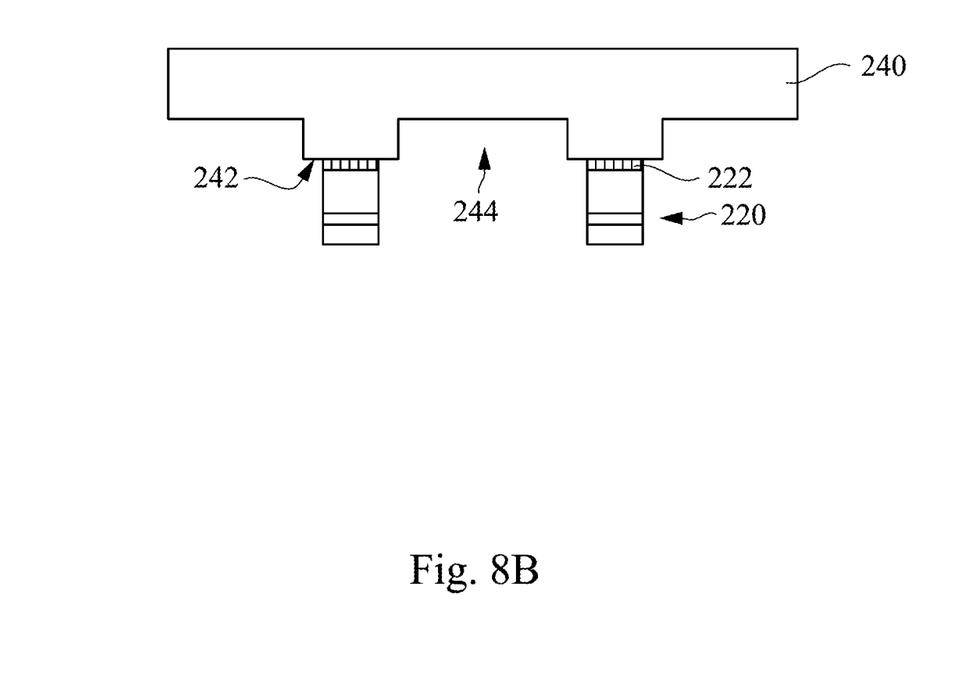
FIG. 8B is a schematic cross-sectional view of an intermediate step of the method for transferring the micro device in some embodiments of the present disclosure.

References are made to FIGS. 8A and 8B. FIGS. 8A and 8B are schematic cross-sectional views of intermediate steps of the method 100 illustrated in FIG. 1. In alternative embodiments, at least one of the micro devices 220 has a photoresist layer 222 thereon. The photoresist layer 222 may be optionally needed during a fabrication process such as dicing. The photoresist layer 222 is coated onto at least one of the micro devices 220 to act as a mask for dicing after said photoresist layer 222 is patterned. The photoresist layer 222 may be a positive photoresist layer or a negative photoresist layer, but should not be limited thereto. In the embodiments, the photoresist layer 222 is present on the micro devices 220 before the picking up (referring to FIG. 8A), and the micro devices 220 are attached to the transfer head 240 via the photoresist layer 222 when the picking up is performed (referring to FIG. 8B).

As a result, the method 100 mentioned above supported by FIG. 1 also applies to the present embodiments since the capillary force $f_{CF}$ is still greater than an adhesive force $f_{T4}$ between the photoresist layer 222 and the transfer head 240. Specifically, the micro devices 220 are adhered to the adhesive layer 230 by an adhesive force $f_{AD}$, the micro devices 220 are attached to the transfer head 240 via the photoresist layer 222 by the adhesive force $f_{T4}$, and the capillary force $f_{CF}$ is greater than the adhesive force $f_{T4}$, so that the micro devices 220 are detached from the transfer head 240 and are stuck to the receiving substrate 260 when the placing is performed. The adhesive forces $f_{T4}$ may include van der Waals forces, but should not be limited thereto. During the process of transferring, forces mentioned above obey the following equation:

$$f_{AD} < f_{T4} < f_{CF} \qquad (2)$$

wherein the left-hand of inequality (2) $f_{AD} < f_{T4}$ may be satisfied by choosing suitable combination of materials for the adhesive layer 230, the photoresist layer 222, and a surface of the grip region 242 of the transfer head 240 respectively. For example, the adhesive layer 230 may be made of aforementioned materials. The grip region 242 may be made of aforementioned materials for the adhesive layer 230 and polydimethylsiloxane. The photoresist layer 222 may be made of acrylic resin or novolak resin.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims.

What is claimed is:
1. A method for transferring a micro device, comprising:
    preparing a carrier substrate with the micro device thereon, wherein an adhesive layer is present between and in contact with the carrier substrate and the micro device, wherein the micro device is adhered to the adhesive layer by a first adhesive force;

picking up the micro device from the carrier substrate by a transfer head, wherein the micro device is attached to the transfer head by a second adhesive force;

forming a liquid layer on a receiving substrate; and placing the micro device over the receiving substrate so that the micro device is in contact with the liquid layer and is gripped by a capillary force, wherein a lateral length of the micro device is less than 40 μm, thereby resulting in that the capillary force is greater than the first adhesive force and the second adhesive force so that the micro device is detached from the transfer head and is stuck to the receiving substrate when the placing is performed.

2. The method of claim 1, wherein the first adhesive force and the second adhesive force comprise van der Waals forces.

3. The method of claim 1, wherein the second adhesive force is greater than the first adhesive force.

4. The method of claim 1, wherein a photoresist layer is present on the micro device before the picking up, and the micro device is attached to the transfer head via the photoresist layer when the picking up is performed.

5. The method of claim 4, wherein the micro device is adhered to the adhesive layer by a first adhesive force, the micro device is attached to the transfer head via the photoresist layer by a third adhesive force, and the capillary force is greater than the first adhesive force and the third adhesive force so that the micro device is detached from the transfer head and is stuck to the receiving substrate when the placing is performed.

* * * * *